(12) United States Patent
DelPapa et al.

(10) Patent No.: US 8,797,766 B2
(45) Date of Patent: Aug. 5, 2014

(54) POWER SUPPLY WITH TICKLE PULSE INJECTION

(75) Inventors: Kenneth B. DelPapa, Natick, MA (US); Michael Nussbaum, Newton, MA (US); Andrew Ferencz, Southborough, MA (US)

(73) Assignee: Bose Corporation, Framingham, MA (US)

( * ) Notice: Subject to any disclaimer, the term of this patent is extended or adjusted under 35 U.S.C. 154(b) by 528 days.

(21) Appl. No.: 13/081,105

(22) Filed: Apr. 6, 2011

(65) Prior Publication Data
US 2012/0256685 A1    Oct. 11, 2012

(51) Int. Cl.
*H02M 3/335*    (2006.01)

(52) U.S. Cl.
USPC ........................................ 363/21.01; 363/21.1

(58) Field of Classification Search
CPC ........ H02M 3/3387; H02M 1/44; H03M 3/20
USPC ........... 363/16, 20, 21.01, 21.07, 21.1, 21.15, 363/21.18, 95, 97, 131
See application file for complete search history.

(56) References Cited

U.S. PATENT DOCUMENTS

| | | | |
|---|---|---|---|
| 6,212,079 B1 | 4/2001 | Balakrishnan et al. | |
| 6,236,578 B1 * | 5/2001 | Chen | 363/21.01 |
| 7,477,025 B2 * | 1/2009 | Teng | 315/307 |
| 7,504,815 B2 * | 3/2009 | Moyse et al. | 323/351 |
| 7,605,573 B2 * | 10/2009 | Nishida | 323/282 |
| 2009/0219000 A1 | 9/2009 | Yang | |
| 2011/0019441 A1 | 1/2011 | Djenguerian et al. | |
| 2012/0120687 A1 * | 5/2012 | Ohsaki et al. | 363/21.09 |
| 2013/0154488 A1 * | 6/2013 | Sadwick et al. | 315/172 |

FOREIGN PATENT DOCUMENTS

WO    2009145804 A1    12/2009

OTHER PUBLICATIONS

The International Search Report and the Written Opinion of the International Searching Authority dated Jul. 5, 2012 for PCT/US2012/032115.
Datasheet for Intersil Corporation; High Efficiency System Power Supply Controller for Notebook Computers, ISL6232, Apr. 20, 2009.
Maxim Integrated Products; High-Efficiency, Quad Output, Main Power-Supply Controllers for Notebook Computers MAX1777/MAX1977/MAX1999 Data Sheet, Sep. 2004.
National Semiconductor Corporation; LM502 AC-DC Current Mode PWM Controller Datasheet, Oct. 29, 2010.
Datasheet for on Semiconductor NCP1380, Quasi-Resonant Current-Mode Controller for High-Power Universal Off-Line Supplies, dated Dec. 2009.
Datasheet for on Semiconductor NCP1379, Quasi-Resonant Current-Mode Controller for High-Power Universal Off-Line Supplies, dated Dec. 2009.

(Continued)

*Primary Examiner* — Matthew Nguyen

(57) ABSTRACT

A power supply injects a series of "tickle" pulses into a pulse width modulated (PWM) controller to induce the controller to generate PWM pulses at a minimum switching frequency, preferably one that is super-sonic (especially for audio applications). The switching frequency may also be selected or controlled such that it avoids resonances in the power supply. The "tickle" pulses may be clocked by the same clock that times the PWM controller, and they may be shaped to help ensure that the power supply maintains some regulation during low-load conditions.

25 Claims, 9 Drawing Sheets

(56) References Cited

OTHER PUBLICATIONS

Datasheet for Texas Instruments TPS53311, 3-A Step-Down Regulator with Integrated Switcher, Jun. 2010 (revised Mar. 2011).

Crabtree, Stephanie; "Solving the Valley Jumping Issue in Quasi-Square Wave Resonant Power Supplies", Power Electronics Technology, dated Jun. 1, 2011.

* cited by examiner

POWER SUPPLY WITH TICKLE PULSE INJECTION

BACKGROUND

This disclosure relates to switching power supplies.

Switching power supplies are commonly used in a wide variety of applications, including audio applications. In audio applications, there are often times when an audio amplifier powered by a power supply draws little or no power. For example, a brief period of silence during a song or other audio rendering causes the amplifier to draw relatively little power. This low-load condition can cause the switching power supply to switch its power switches at reduced frequencies or stop switching altogether. The switching is poorly controlled and can cause undesirable audible artifacts or holes in the amplifier's performance.

SUMMARY

In one aspect, a power supply employs a method for injecting a series of "tickle" pulses into a pulse width modulated (PWM) controller to induce the controller to generate PWM pulses at a minimum switching frequency, that is preferably super-sonic for audio applications. The switching frequency may also be selected or controlled such that it avoids resonances in the power supply.

In another aspect, a power supply includes a power supply includes an output node that delivers a target output voltage to a variable load, one or more power switches that controls power delivered to the output node, and a controller that produces a series of variable width pulses that control operation of the power switches such that the output node delivers a near-constant target output voltage to the load, wherein the controller receives an error signal indicating the difference between an actual voltage at the load and the target voltages and alters at least the width of the pulses delivered to the power switches based on the error signal. The power supply also includes a tickle pulse generator that generates a series of tickle pulses that are combined with the error signal supplied to the controller such that at least some of the pulses cause the controller to generate a pulse delivered to the power switches when the load draws little or no power (e.g., a small amount of power when compared with an average power draw of the load).

In another aspect, an audio system may include one or more speakers and an audio amplifier that powered by a PWM power supply having a tickle pulse generator that introduces a series of tickle pulses into the PWM controller to cause the controller to generate PWM pulses at a minimum switching frequency, that is preferably a non-audible frequency.

Embodiments may include one or more of the following features. The power supply may also include a clock that supplies a clocking signal to the controller such that the controller is able to generate variable width pulses on some number of clock pulses—for example, an even number (such as every other clock pulse) or an odd number of clock pulses. The same clocking signal may also be provided to the tickle pulse generator to time generation of tickle pulses. The tickle pulse generator may be configured such that it generates tickle pulses on some odd number of clocking pulses. It may also be configured such that it generates tickle pulses on some even number of tickle pulses, and may be further configured to determine if the tickle pulses are aligned with switching opportunities, and, if not, then shifting the tickle pulse waveform by one or more clocking pulses to get such an alignment.

The tickle pulse generator may include a delay element that delays generation of tickle pulses from, for example, a clocking signal. This delay may be introduced in order to more precisely align the tickle pulses with PWM switching opportunities of the PWM controller.

The tickle pulse generator may generate a tickle pulse waveform having any shape—for example, a square wave shape, triangle wave shape, saw tooth wave shape, etc. It may generate tickle waves that have a shape that enables the error signal to affect the width of the PWM pulses triggered by a tickle pulse (thus, enabling some regulation). The shape of the tickle pulses may be such that they have a fast attack and a slow decay (e.g., a fast rising edge of the tickle pulse when compared with its falling edge). The tickle pulses may have a linear or non-linear rising or falling slopes.

The frequency of the tickle pulse may be selected or controlled to minimize the chance that PWM pulses will occur at an audible switching frequency. The tickle pulse frequency may also be selected or controlled to avoid resonances in the power supply.

The tickle pulse generator may also monitor changes in the PWM switching frequency as the load demand on the power supply transitions from a low power state to a normal power state. The tickle pulse generator may adjust the shape of the tickle pulses based on the frequency (or change in frequency) of the PWM pulses produced by the PWM controller. The tickle pulse generator may also alter the frequency of the tickle pulses based on the frequency (or change in frequency) of the PWM pulses produced by the PWM controller. The tickle pulse generator may change the shape and/or frequency of the tickle pulses to minimize the chances that the changes in the frequency of PWM pulses cause audible artifacts as the load demand transition from a low demand state.

The tickle pulse generator may be implemented digitally or in analog form. The tickle pulse generator, controller, clock, and power switches (or combinations thereof) may be implemented digitally on the same silicon.

DETAILED DESCRIPTION

Figure 1:
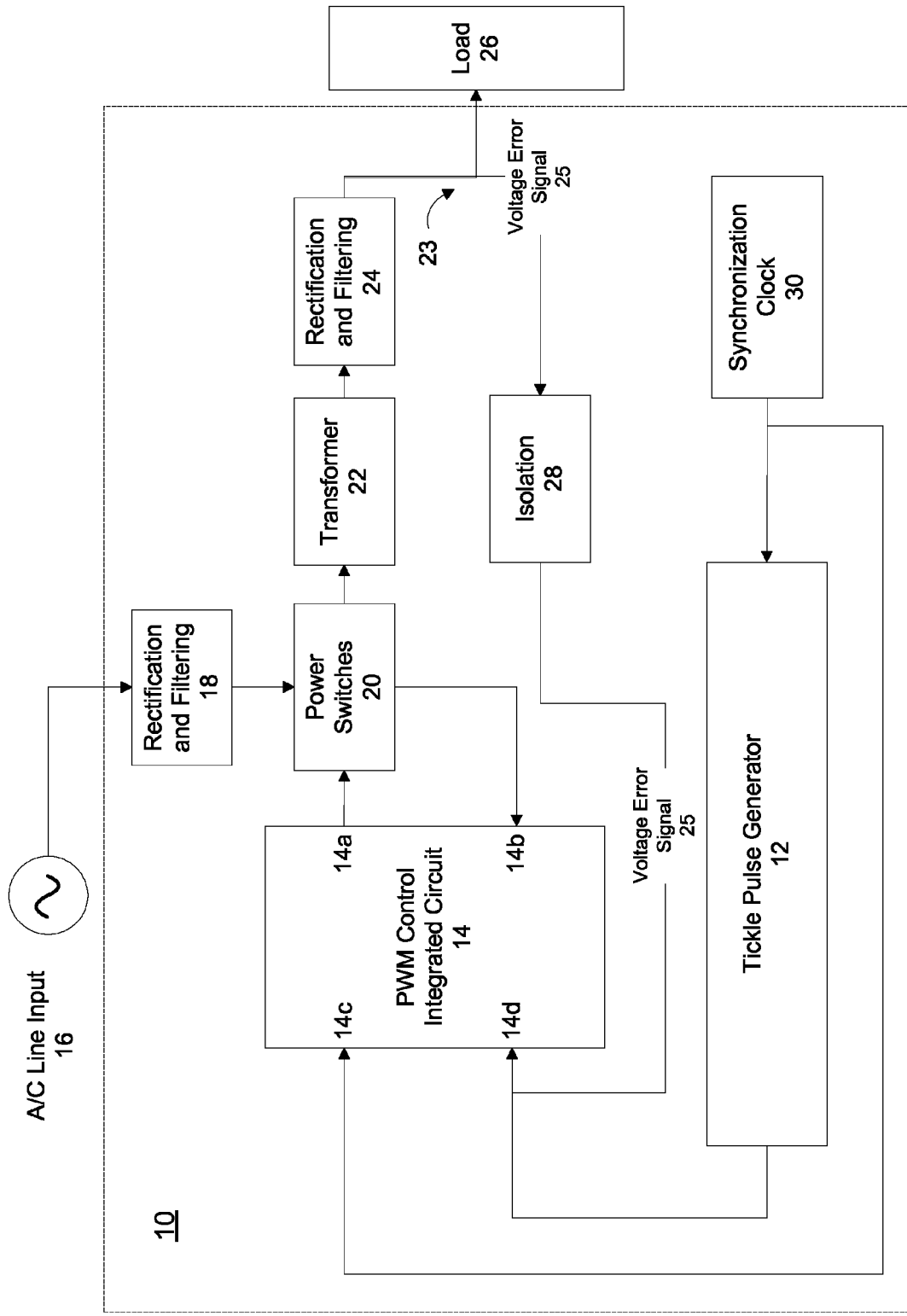
FIGS. 1 and 3 are each a block diagram of a switching power supply with a tickle pulse generator.

As shown in FIG. 1, a power supply 10 includes a tickle pulse generator 12 that periodically injects a "tickle" signal into the pulse width modulator (PWM) controller 14 to trigger a switching event when the power supply 10 is lightly loaded. The PWM controller 14 includes four terminals: (i) a PWM output terminal 14*a*, (ii) a current sense input terminal 14*b*, (iii) a clock input terminal 14*c*, and (iv) a current command input terminal 14*d*.

The power supply 10 also includes an alternating current (A/C) line input 16 that is fed through a rectification and filtering stage 18 and delivered to the power switches 20. The output of the power switches 20 is delivered to the transformer 22 and finally to another rectification and filtering stage 24 where it is delivered to output node 23. The output node 23 is connected to a variable load 26, such as a power amplifier for a loudspeaker driver. The controller 14 operates the power switches to provide a target voltage at the load (e.g., 24V). A voltage error signal 25, which represents the difference between the actual voltage at the output node 23 and the target voltage, is fed through an isolation circuit 28 (e.g., a transformer or an optical isolator) to the current command input terminal 14d of the PWM controller 14. A synchronization clock 30 generates a clocking signal that is fed both to the tickle pulse generator 12 and to the clock input terminal 14c of the PWM controller.

In operation, the load 26 draws current from energy supplied at the output node 23, causing the voltage error signal 25 to increase in magnitude. When the PWM controller 14 senses that the amplitude of the voltage error signal 25 has exceeded some threshold amount (e.g., 1.5V), it will deliver an output pulse to turn "on" the power switches to deliver power to the load and pull the node at the output node 23 back up to the target output voltage.

The PWM controller 14 is clocked by the synchronization clock 30 and is typically programmed such that it will produce PWM pulses at some minimum interval of input clock pulses. For example, the PWM controller may be programmed to deliver an output pulse at no more than every other input clock pulse. Thus, only some input clock pulses present a switching opportunity for the PWM controller. At each switching opportunity, the PWM controller compares the voltage of the signal present at the current command input terminal 14d with the predetermined switching threshold voltage (e.g. 1.5V). If the switching threshold voltage is exceeded, the PWM controller 14 generates a PWM pulse at its output terminal 14a, thus turning on the power switches. The actual PWM switching window for a real-world (i.e., non-idealized) PWM controller typically occurs at a small, but non-negligible time interval after a clock pulse signal. This time delay varies depending on the particular PWM controller selected for implementation.

When a PWM pulse is triggered, the PWM pulse stays "high" (keeping the power switches on) until the current sense input 14b exceeds a threshold determined by the amplitude of the voltage error signal, at which point the controller 14 terminates the pulse and the power switches 20 are turned off. This process continues and the power supply 10 provides smooth, regulated power to the load.

When the power demands of the load are temporarily low (e.g., a period of silence during a song), the PWM controller 14 may be configured to skip pulses. Some off-the-shelf PWM controllers, such as the LM5021 sold by National Semiconductor of Santa Clara, Calif., USA, provide built-in pulse skipping modes of operation. Pulse skipping is typically done by sensing a drop in the voltage error signal to detect light load conditions and, in response, generating PWM pulses at a reduced average frequency that obtains a lower effective duty ratio. Commonly, this frequency reduction is done by terminating all switching for some period of time until the voltage error exceeds some threshold, and re-engaging switching after the voltage error signal is lowered by some amount, controlling periods of switching and no switching by some hysteretic window of the voltage error signal. However, the switching frequency may be reduced to an audible range under some low-load conditions, which is particularly undesirable in audio applications. Moreover, PWM controllers in pulse skip mode have a tendency to go through a relatively long period of no pulses, followed by a short burst of pulses to bring up the output voltage, followed by another long period of no pulses. This operation is somewhat chaotic and can also create audible artifacts.

Additionally, if the power supply powers a reactive load (e.g., am audio amplifier driving a highly reactive load), the load will return excess power back to the power supply. This creates an overvoltage condition, causing the voltage error signal to go negative, which, in turn, causes the PWM controller to produce no pulses at all. If too many PWM pulses are skipped, the housekeeping power supplies (e.g., power supplies for the PWM controller and gate drive circuits for the power switches) that share the same magnetics as the primary power supply transformer experience a voltage drop sufficient to cause one or more of the housekeeping functions to fail. This, in turn, can force the power supply to shutdown and then restart, creating holes in the power supply's performance (which, in the case of an audio amplifier, creates periods of "holes" or "drop-outs" during audio reproduction).

The inclusion of the tickle pulse generator 12 (shown in FIG. 1) permits pulse skipping during periods of light loads, but helps to ensure that the pulse skipping is accomplished in a more orderly, deterministic manner. More particularly, the tickle pulse generator injects a series of "tickle" pulses into the voltage feedback signal to ensure that the PWM controller generates pulses at an acceptable frequency during low load conditions.

Figure 2:
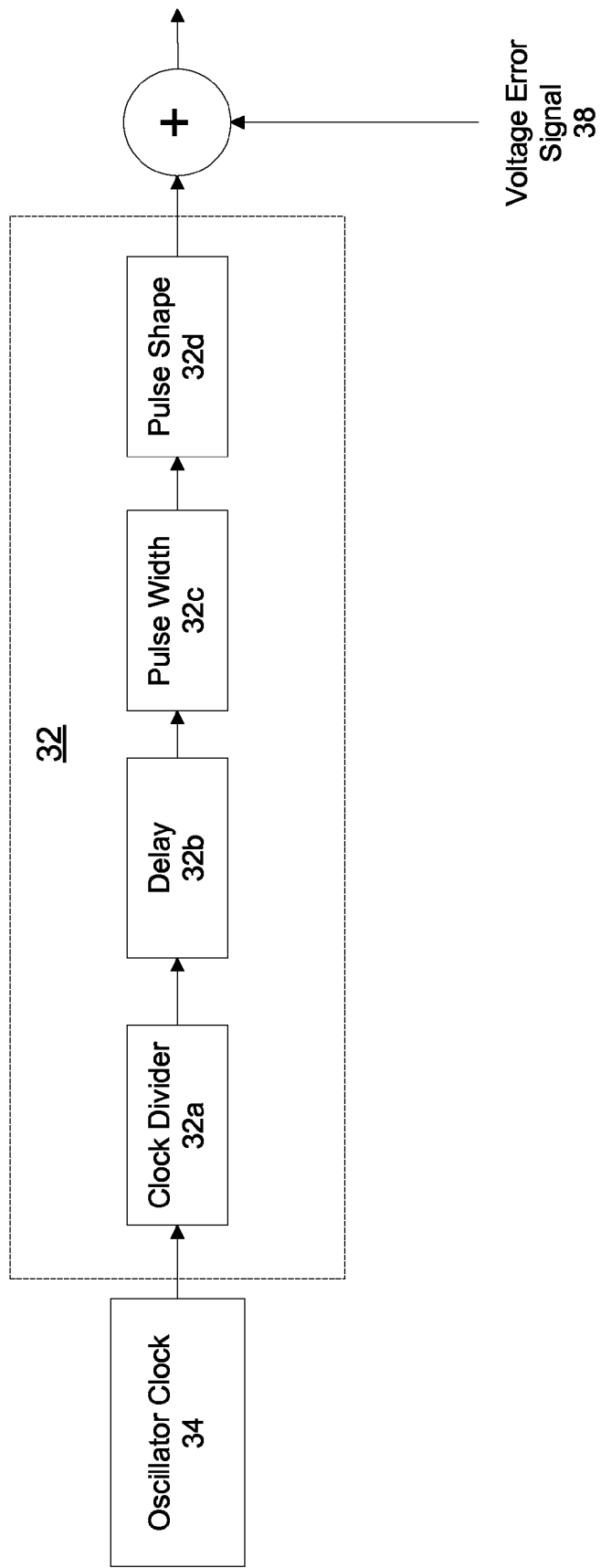
FIG. 2 is a block diagram of an example of a tickle pulse generator.

An example of a tickle pulse generator is shown in FIG. 2. In this particular example, the tickle pulse generator 32 includes four elements: a clock divider 32a, a delay element 32b, a pulse width element 32c, and a pulse shape element 32d. The input to the tickle pulse generator 32 is an oscillator clock 34, and the output of the tickle pulse generator 32 is combined with a voltage error signal 38. This combined signal is fed into the current command input terminal of a PWM controller (not shown in FIG. 2).

In operation, the clock divider 32a receives the input from the oscillator clock 34 and divides by some interval, preferably an odd interval (which will be explained more below). Thus, the output of the clock divider 32a defines the frequency at which tickle pulses are generated. The delay element 32b introduces a small delay to each tickle pulse to position the tickle pulse near the actual trigger point of the PWM controller. (As mentioned above, the actual switching opportunity in PWM controllers occurs at some small time after a clock pulse). The pulse width element 32c defines the length (or width) of each tickle pulse. Finally, the pulse shape element 32d defines the shape of each tickle pulse. As will be explained more below, the shape of the tickle pulse can be made to have a fast attack (i.e., a steep slope on its rising edge) and a relatively slow decay (i.e., a relatively slight slope on its falling edge).

Figure 3:
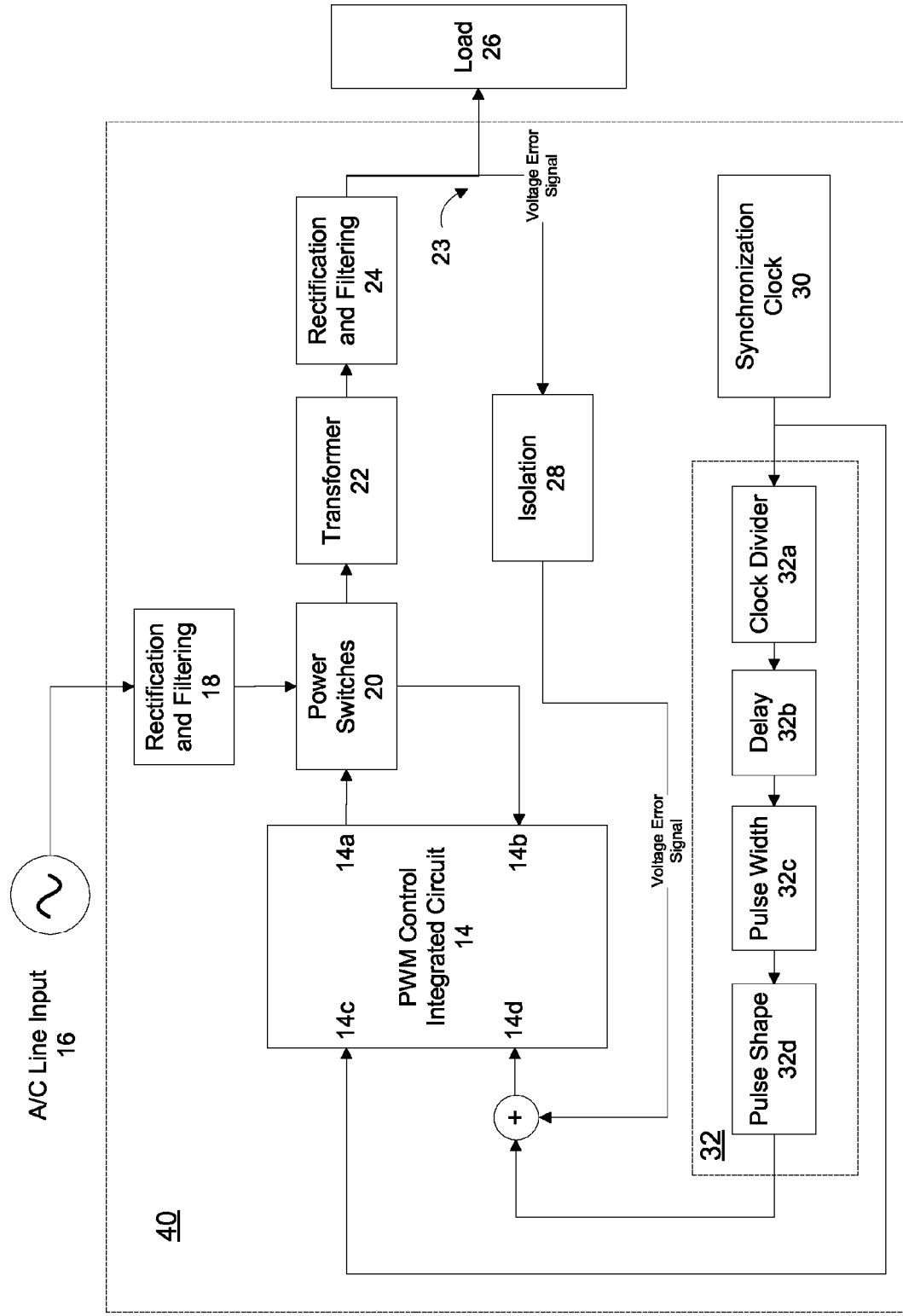

Tickle pulse generator 32 can be understood further by looking at it within a power supply. For example, as shown in FIG. 3, tickle pulse generator 32 is incorporated in power supply 40, which contains the same elements as the power supply as shown in FIG. 1. Note that in this implementation the tickle pulse generator 32 and the PWM controller 14 share the same synchronization clock—namely clock 30.

Figure 4:
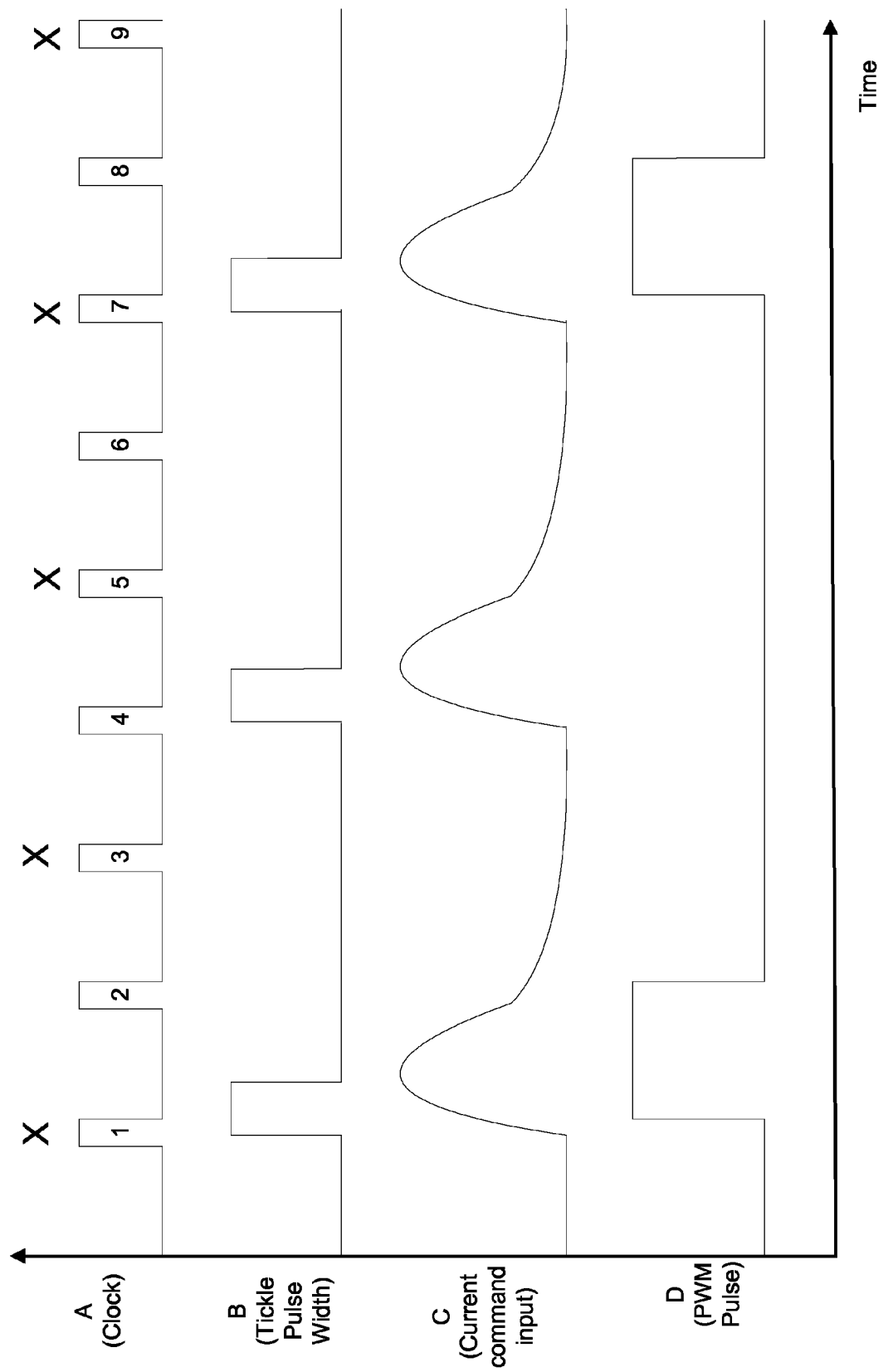
FIGS. 4, 6, 7 and 9 are an idealized timing diagrams illustrating operation of switching power supplies with a tickle pulse generator.

FIG. 4 illustrates an idealized timing diagram of the following signals generated under low load conditions within power supply 40 shown in FIG. 3:

Row A: the output waveform of the synchronization clock 30;

Row B: the output waveform of the tickle pulse width element 32c;

Row C: the input waveform to the current command input 14d to the PWM controller 14 (which is the sum of the voltage error signal 25 and the output of the tickle pulse generator 32); and Row D: the output waveform of the PWM output terminal 14a of the PWM controller 14.

The timing diagram in FIG. 4 illustrates nine (9) clock pulses produced by the synchronization clock 30 (these are labeled 1-9 in row A). As is common in switching power supplies, the input clock is divided by two to ensure a 50% maximum duty cycle. Thus, a PWM pulse opportunity is available at every other clock pulse—these PWM pulse opportunities are labeled with an "X" on FIG. 4 at clock pulses 1, 3, 5, 7, and 9. This example assumes the switching opportunity for the PWM controller occurs shortly after the leading edge of the clock pulses. (In other implementations, the PWM controller may be programmed such that the switching opportunity occurs at or near the trailing edge of the clock pulses.)

The tickle pulse generator 32 receives the clocking signal from the synchronization clock and divides it by a factor of three (3) in the clock divider block 32a of FIG. 3. The delay element 32b and pulse width element 32c define the start and end times for each tickle pulse. Thus, the tickle pulse generator 32 is paced to generate a tickle pulse at shortly after every third clock pulse (i.e., clock pulses 1, 4 and 7 in FIG. 4).

The square wave tickle pulse signal (row B in FIG. 4)) is fed into the tickle pulse shape element 32d in FIG. 3 to produce a pulse-shaped waveform with a fast attack and relatively slow decay. The output of the tickle shape element 32d is combined with the voltage error signal to produce the waveform shown in row C of FIG. 4. The combination of the voltage error signal and tickle pulse generator is input into the current command input terminal 14d of the PWM controller and causes the PWM controller to generate PWM pulses at a regular interval—in this case, at every six (6) clock pulses (pulses 1 and 7 shown in row D of FIG. 4).

Note that in the example illustrated in FIGS. 3 and 4 it is advantageous to generate tickle pulses at an odd increment of clock pulses. Since the tickle pulse generator and PWM controller reference the same clock signal and the PWM controller is programmed to generate PWM pulses at no more than every other clock pulse, selecting an odd increment to generate a tickle pulse ensures that every other tickle pulse is positioned at times likely to trigger a PWM pulse and other tickle pulses will be positioned at times which have a low likelihood of influencing PWM pulse generation. If the tickle pulse generator is timed to generate a tickle pulse on some even increment of clock pulses, there is a chance that the tickle pulses will never align with a PWM pulsing opportunity. For example, if the tickle pulse generator generated tickle pulses at every other clock pulse (similar to the PWM controller), the low load condition may arise at a time such that the tickle pulses are generated at times when there is no PWM switching opportunity (i.e., clock pulses 2, 4, 6, 8, etc. in FIG. 4). In this case, the influence of the tickle pulse is slight, and the situation of not triggering any PWM pulses remains. Nevertheless, some implementations may generate tickle pulses on an even number of synchronization clock cycles. In such systems, though, it is preferable to employ a technique for ensuring that the tickle pulses align with PWM switching opportunities (e.g., detecting whether the tickle pulse is near an switching opportunity, and if not, injecting a extra clock pulse into the tickle pulse divider element to align the tickle pulse waveform with the PWM switching opportunities.)

In any case, the frequency of tickle pulses can be selected to avoid a switching frequency falling within an audible range. For example, the tickle pulse frequency may be selected such that it is above 20,000 Hz. Similarly, the switching frequency may be selected to ensure sufficient voltage regulation across the transformer to prevent the housekeeping function from failing.

Figure 5:
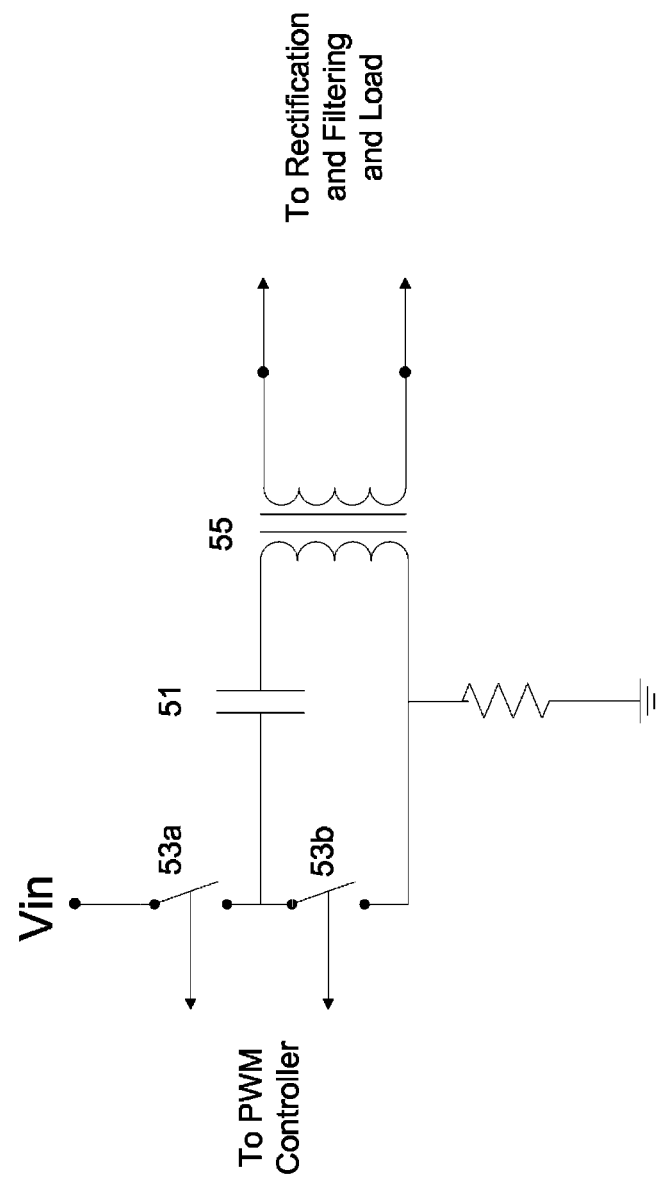
FIG. 5 is a circuit diagram of power switches and a transformer in a switching power supply.

Another factor that may influence selection of the frequency of tickle pulses is resonances present within the power supply. These typically want to be avoided in order to minimize losses. For example, consider the circuit diagram shown in FIG. 5, which shows a pair of power switches 53a, 53b coupled to a transformer 55 in a half-bridge configuration. A capacitor 51 is located between the power switches and the primary winding of the transformer. When a PWM pulse supplied by the PWM controller goes "high", switch 53a is turned on and switch 53b is turned off, which causes current to flow through capacitor 51 and through the primary winding of the transformer 55. When the PWM pulse goes "low", switch 53a is turned off and switch 53b is turned on, which causes current to flow back and forth between the primary winding of the transformer and the capacitor 51. Thus, the capacitor and primary winding form a tank circuit, and a tank current can form as energy flows between these elements. The tank circuit has a known resonance at the following frequency:

$f=1/[2\pi((LC)^{1/2})]$, where L is the equivalent inductance of the primary winding of transformer 55 and C is the capacitance of the capacitor 51.

The frequency of the tickle pulses may be selected to avoid this resonance (and other resonances present in the power supply). By avoiding these resonances, the magnitude of the tank current flowing between the capacitor and primary winding is reduced, which, in turn, reduces resistive losses experienced in the tank circuit.

In some embodiments, the tickle pulse may be a simple square wave. However, using a shaped tickle pulse wave offers some benefit by making the width of the generated PWM pulse dependent on the voltage error signal. This helps the amplifier to maintain some voltage regulation in low load conditions.

Figure 6:
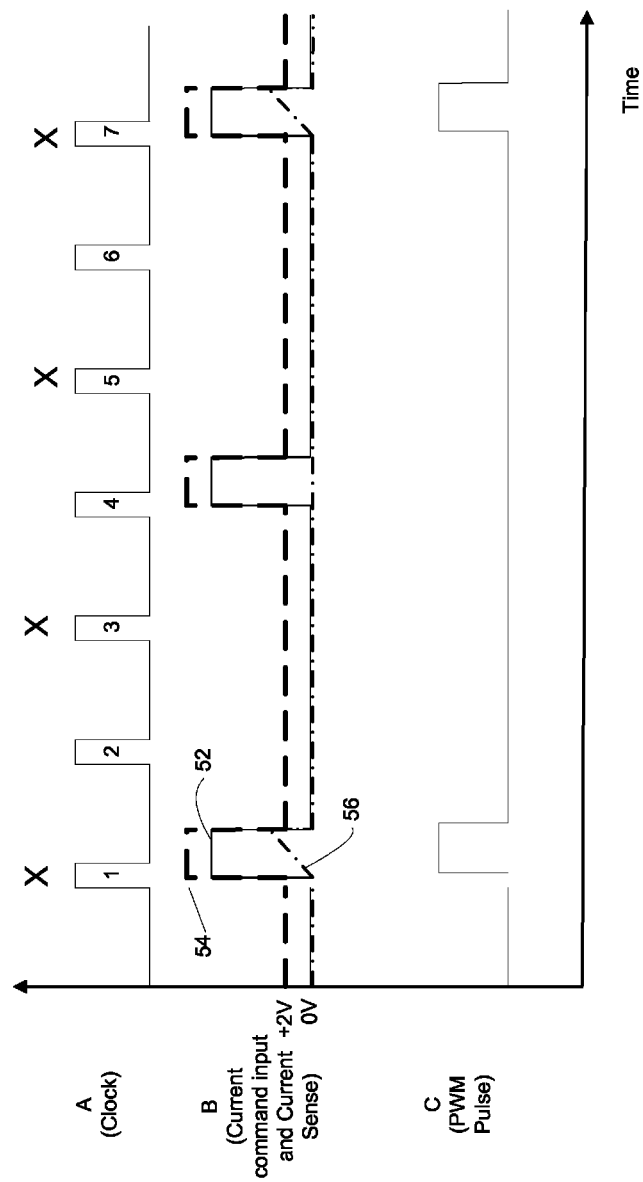

For example, consider the set of idealized timing diagrams shown in FIG. 6 for the power supply shown in FIG. 3. Row A shows the series of clock pulses output by a synchronization clock 30 (shown in FIG. 3). Row B of the timing diagram shows three overlaid signals: (i) a square tickle pulse wave with a zero voltage error signal (signal 52 shown in solid line); (ii) a square tickle pulse wave with a 2 volt voltage error signal (signal 54 shown in heavy dashed line); and (iii) a current sense signal (signal 56 shown in dash-dot line). Since the voltage error signal changes slowly relative to the PWM switching, the voltage error signal appears as a DC offset to the tickle pulse wave—as shown in FIG. 6, the 2-volt voltage error signal raises the entire tickle pulse waveform by 2 volts. The current sense signal 56 represents the current flowing through the power switches 20 (shown in FIG. 3). When the PWM pulse goes high, the power switches are turned on and current begins to flow. The PWM controller 14 (shown in FIG. 3) terminates the PWM pulse when the current sense signal at terminal 14b intersects with the voltage error signal present at terminal 14d of the PWM controller. By using a square wave tickle pulse (signals 52 or 54), the width of the PWM pulse is not affected by the voltage error signal (approximated as a DC offset).

However, by shaping the tickle pulse signal as a pulse train with a fast attack and slow decay, the voltage error signal affects the width of the PWM pulse and some voltage regulation occurs. For example consider the set of idealized timing diagrams shown in FIG. 7 for the amplifier shown in FIG. 3. In this case, shaped tickle pulse waves are used. Specifically, tickle pulse signal 62 has a tickle pulse train that consists of a series of pulses with a fast attack and relatively slow decay. Note that between the first and third tickle pulse, the signal 62 experiences a 2-volt DC offset from the voltage error feedback signal, raising the tickle pulse signal 62 by 2 volts. Because the tickle pulses are shaped, the voltage error signal affects the width of the "tickled" PWM pulse. In particular, the first tickle pulse 62a has roughly a zero-volt DC offset and generates a PWM pulse having a pulse width of d1. The third tickle pulse 62c has roughly a 2-volt DC offset and generates a PWM pulse having a width of d2, which is greater than d1. This is because it takes longer for the current sense signal 64 to intersect with the tickle pulse signal 62 when a DC-offset is present. Thus, the amplifier continues some voltage regulation even in low load periods when the tickle pulse signal triggers periodic PWM pulses.

Figure 8:
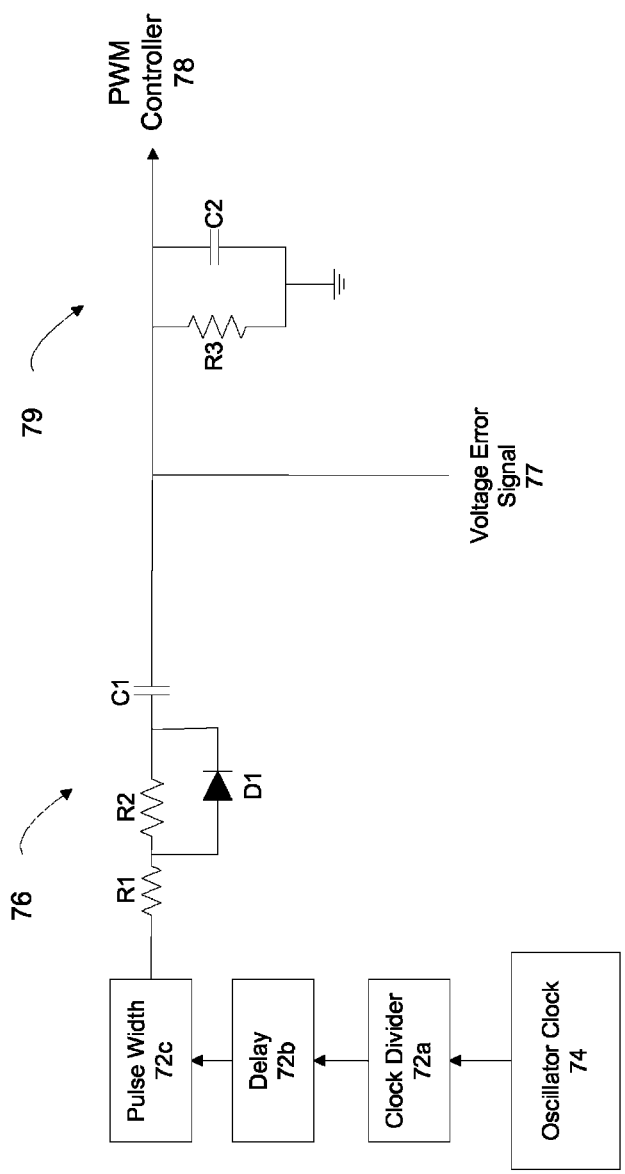
FIG. 8 is an example of a tickle pulse shaping circuit.

FIG. 8 illustrates an example of circuitry that may be used to generate a shaped tickle pulse. As shown, a tickle pulse circuit receives a clocking signal from an oscillator clock 74, applies a clock divider 72a, a delay 72b, and a pulse width element 72c. Collectively these four elements (74, 72a-72c) produce a square wave pulse train that is fed into the shaping circuit 76. The shaping circuit 76 consists of two resistors R1, R2 in series with a capacitor C1. A diode D1 is in parallel with resistor R2. The output of the shaping circuit 76 is connected to an R-C circuit 79 that is part of the feedback compensation loop. The voltage error signal 77 (which is typically a current signal) is fed into the node between the shaping circuit 76 and the R-C circuit 79. The output of the R-C circuit 79 is connected to the current command input terminal of the PWM controller 78.

Figure 7:
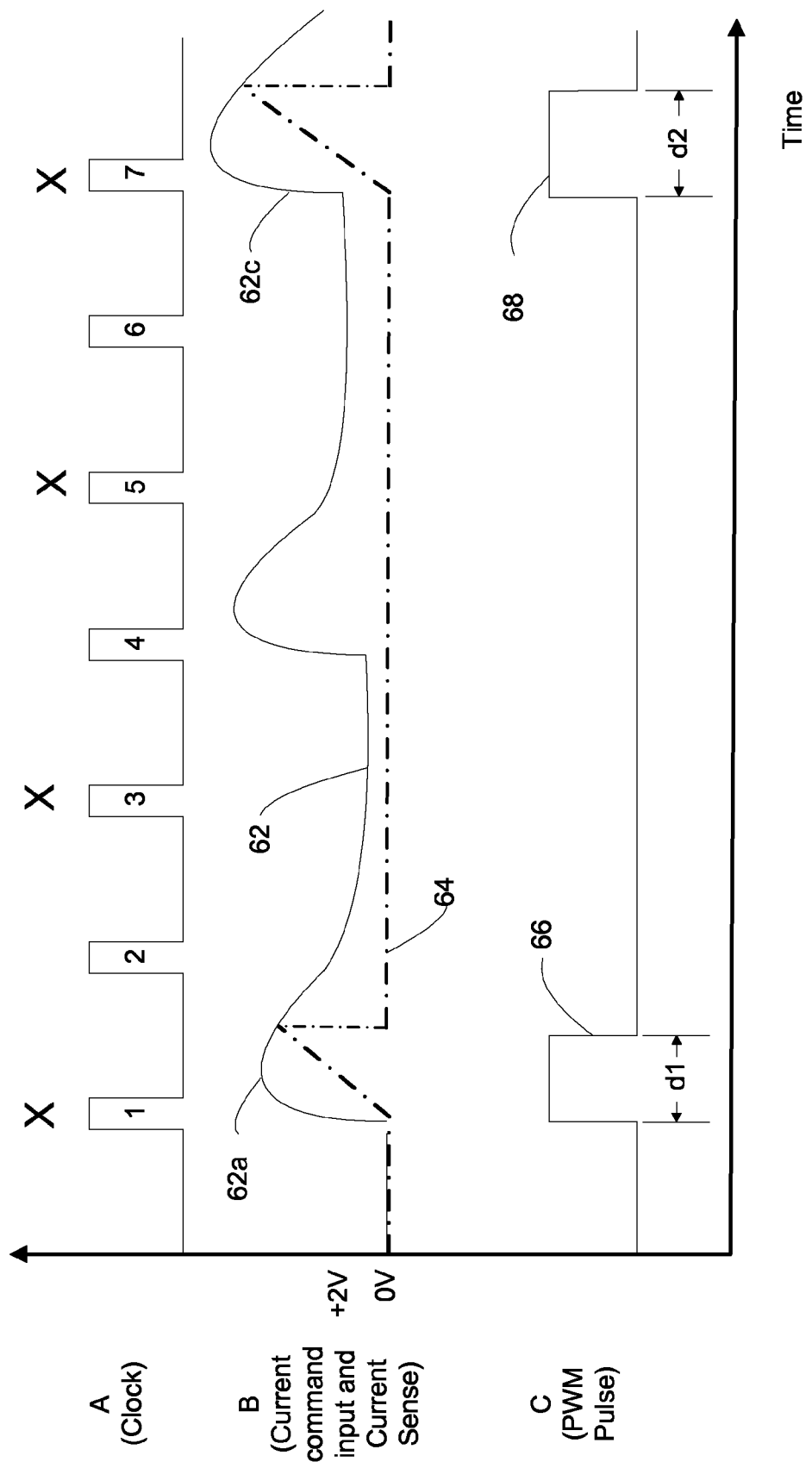

At high frequencies (e.g., near the leading edge of each square pulse), current will flow through diode D1, bypassing resistor R2 and charging capacitor C2 via capacitor C1. This creates a fast attack near the leading edge of the square wave. As the input square wave goes low, capacitor C2 discharges, creating a slow decay. Note that the tail of the tickle pulse is what causes some regulation. In some implementations, the shape of the tail of the tickle pulse may be fixed and regulation only occurs by raising (or lowering) the tickle pulse waveform according to the voltage error signal (this is what is shown in FIG. 7). In other implementations, the decay of the tail may also change according to the magnitude of the voltage error signal. Note that there is an inverse relationship between the decay of the tail and the width of a corresponding PWM pulse—a tickle pulse with a tail that decays slower will produce a wider PWM pulse versus a tail that decays faster. If a tickle pulse has a tail that decays too slowly, it risks triggering a PWM pulse at an unplanned time. For example, if the tail of the tickle pulse waveform shown in row B of FIG. 7 decayed very slowly, there is a chance that it may be at a high enough voltage level to trigger a PWM pulse at switching opportunity corresponding to clock pulse 5 (shown in row A of FIG. 7). Thus, the shape of the tickle pulse (and in particular its tail) should be selected such that it permits some regulation when a PWM pulse is triggered, but the shape should also be made so as to avoid triggering a PWM pulse at an unplanned time.

The risk of a tickle pulse triggering a PWM pulse at an unplanned time increases as the power supply transitions out of a low-load state. Specifically, as the load demand increases, so does the voltage error signal. A rising voltage error signal causes a corresponding rise in the signal present at the current command input terminal of the PWM controller. Moreover, in implementations where the tail of the tickle pulse is affected by the voltage error signal, a rise in the voltage error signal can cause the slope of the tail to decrease. Either of these conditions caused by a rising voltage error signal create a condition where the tail of the tickle pulse risks triggering a PWM pulse at an unintended switching opportunity. For example, consider the idealized timing diagram shown in FIG. 9 for a power supply identical to that shown in FIG. 1 except the tickle pulses are shaped as triangle waves (rather than pulses) in this example. The PWM controller is clocked by the clocking waveform shown in row A of FIG. 9, and it is programmed to have a switching opportunity at a short time after the leading edge of every other clock pulse (i.e., near the leading edge of pulses 1, 3, 5, and 7 in FIG. 9). Row B illustrates the input to the current command input to the PWM controller. The dashed line 90 represents the threshold voltage for a PWM pulse. In other words, if the PWM controller 14 (shown in FIG. 1) detects a voltage above the threshold voltage 90 at a switching opportunity (i.e., near the leading edge of clock pulses 1, 3, 5, and 7), the PWM controller will generate a PWM pulse. The system generates a tickle pulse 92a-92c at every third clock cycle—namely, clock pulses 1, 4, and 7. The first tickle and third tickle pulses 92a, 92c generated at the first and seventh clock pulse triggers corresponding PWM pulses 94a, 94c (shown in row C of FIG. 9). However, the voltage error signal has raised the voltage level of the current command input such that the tail of the second tickle pulse 92b is above the threshold 90 at the switching opportunity presented at the fifth clock pulse, and a corresponding PWM signal 94b is generated. This creates a state where the PWM controller is jumping between two tickle pulse frequencies (in this case, some PWM pulses occur at every sixth clock pulse while others occur at every forth clock pulse). This jumping between switching frequencies can be chaotic and create audible artifacts. A solution to this problem is to monitor the PWM pulses triggered by the tickle pulses and, if the PWM controller begins to jump between switching frequencies, the system can adjust the shape of the tickle pulses to motivate PWM pulses at the present frequency. Alternatively (or in addition to adjusting the shape), the system can adjust the frequency of the tickle pulses. In the example shown in FIG. 9, the system would switch to a tickle pulse waveform that motivates PWM pulses at every forth clock pulse (rather than at every sixth clock pulse). If this causes too much increase in output voltage, the voltage error remains able to decrease the current command and return to the lower switching frequency. At this point, the tickle pulse shape is adjusted to motivate pulses at this frequency. This eliminates alternating between the frequencies at an audible rate. While this solution may be implemented using analog circuitry, the solution is particularly well-suited for a digital implementation.

Figure 9:
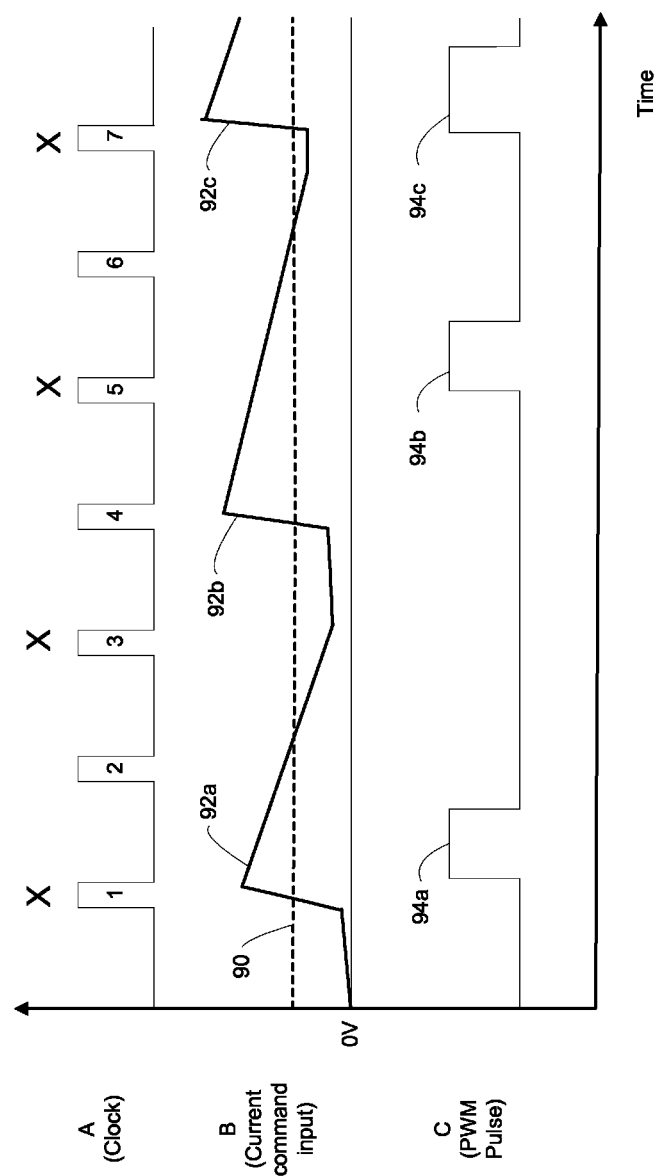

While the examples illustrated in FIG. 6 shows a tickle pulse waveform with a square wave, FIGS. 4 and 7 show a tickle pulse waveform having a pulse shape, and FIG. 9 shows a triangle shape, other implementations may use other known shaping circuits or techniques to produce waveforms of various other shapes (e.g., saw tooth waves, waves with linear roll-off, waves with exponential roll-off, etc.). As noted above, waveforms with a fast attack and relative slow decay have some advantage over square waveforms.

A number of implementations have been described. Nevertheless, it will be understood that additional modifications may be made without departing from the spirit and scope of the inventive concepts described herein. For example, the elements are illustrated in the above embodiments in distinct "boxes", but other implementations may combine two or more of the "boxes" into a single physical component. Similarly, some embodiments are illustrated with analog circuitry (e.g., FIGS. 5 and 8), but the system may be implemented digitally with, for example, a microcontroller. In fact, digital implementations may provide some advantages over an analog implementation including a better ability to hop between switching frequencies in a more deterministic manner, better handling of the transition from idle to some load by frequency hopping outside of any audio band frequency, ability to vary tickle pulse width instead of (or in addition to) pulse shape as an additional means of adjustment, and monitoring the overvoltage condition and adjusting the switching frequency if the overvoltage become excessive. Also, the systems described above can work in a number of applications, and are particularly well-suited for applications for handling reactive loads and loads that can handle less precise power regulation. Examples of applications that are well-suited for the types of systems described above include audio amplification and battery chargers (which experience a light load near the end of a charging cycle). Accordingly, other embodiments are within the scope of the following claims.

What is claimed is:

1. A power supply comprising:
   an output node that is configured to deliver a target output voltage to a variable load;
   one or more power switches that controls power delivered to the output node;
   a controller configured to produce a series of variable width pulses that control operation of the power switches such that the output node delivers a near constant target output voltage to the load, wherein the controller is configured to receive an error signal indicating the difference between an actual voltage at the load and the target voltage and alter at least the width of the pulses delivered to the power switches based on a hysteretic window of the error signal;
   a tickle pulse generator configured to generate a series of tickle pulses that are combined with the error signal supplied to the controller, wherein at least some of the pulses cause the controller to generate a pulse delivered to the power switches when the load draws little or no power.

2. The power supply of claim 1 further comprising a clock that supplies a clocking signal to the controller, wherein the controller is configured such that it is able to generate variable width pulses on even number of clocking signals supplied to the controller.

3. The power supply of claim 2 wherein the controller is configured such that it is able to generate variable width pulses on every other clocking signal supplied to the controller.

4. The power supply of claim 2 wherein the clocking signal is also supplied to the tickle pulse generator to time the generation of tickle pulses.

5. The power supply of claim 4 wherein the tickle pulse generator is configured such that it generates its series of tickle pulses on an odd number of clocking signals.

6. The power supply of claim 4 wherein the tickle pulse generator is configured such that it generates its series of tickle pulses on an even number of clocking signals.

7. The power supply of claim 4 wherein the tickle pulse generator further comprises a delay element that introduces a time delay between a pulse in the clocking signal and a tickle pulse that it triggered by the pulse of the clocking signal.

8. The power supply of claim 1 wherein the tickle pulse generator is configured to generate a series of tickle pulses that are shaped approximately as a square wave.

9. The power supply of claim 1 wherein the tickle pulse generator is configured to generate a series of tickle pulses that are shaped approximately as a triangle wave.

10. The power supply of claim 7 wherein the tickle pulses have a fast leading edge and comparatively slow trailing edge.

11. The power supply of claim 1 wherein the width of the variable width pulses produced by the controller in response to the series of tickle pulses is based on both the amplitude voltage error signal and the shape of the tickle pulse.

12. The power supply of claim 1 wherein the tickle pulse generator is further configured to monitor changes in the frequency of variable width pulses produced by the controller.

13. The power supply of claim 12 wherein the tickle pulse generator monitors changes in the frequency of variable width pulses as the load transitions from drawing little or no power to drawing increased power.

14. The power supply of claim 12 wherein the tickle pulse generator alters the frequency of the series of tickle pulses based on changes in frequency of the variable width pulses produced by the controller.

15. An audio system comprising:
    an audio amplifier configured to power one or more audio transducers;
    a power supply configured to deliver a target output voltage to the audio amplifier, wherein the power supply comprises:
      one or more power switches that control power delivered to the audio amplifier;
      a controller configured to produce a series of variable width pulses that control operation of the power switches such that the power supply delivers a new constant target output voltage to the audio amplifier, wherein the controller is configured to receive an error signal indicating the difference between an actual voltage at the audio amplifier and the target voltage and alter at least the width of the pulses delivered to the power switches based on a hysteretic window of the error signal;
      a tickle pulse generator configured to generate a series of tickle pulses that are combined with the error signal supplied to the controller, wherein at least some of the tickle pulses cause the controller to generate a pulse delivered to the power switches when the audio amplifier draws little or no power.

16. The audio system of claim 15 wherein the power supply further comprises a clock that supplies a clocking signal to the controller.

17. The audio system of claim 16 wherein the controller is configured such that it is able to generate variable width pulses on even number of clocking signals supplied to the controller.

18. The audio system of claim 16 wherein the tickle pulse generator is configured to generate its tickle pulses on a multiple of the clocking signals provided by the clock.

19. The audio system of claim 16 wherein the tickle pulse generator is configured to generate its tickle pulses on an odd number of clocking signals provided by the clock.

20. The audio system of claim 16 wherein the tickle pulse generator is configured to generate its tickle pulses on an even number of clocking signals provided by the clock.

21. The audio system of claim 15 wherein the tickle pulse generator is configured to shape its tickle pulse to have a fast attack and comparatively slow decay.

22. The audio system of claim 15 wherein the tickle pulse generator is implemented using one or more digital components.

23. The audio system of claim 15 wherein the tickle pulse generator is implemented using analog components.

24. A method for controlling switching in a pulse width modulated (PWM) power supply with a variable switching frequency, the method comprising:
- obtaining a voltage error signal that represents the difference between a target voltage and an actual output voltage of the power supply provided to a load;
- generating a tickle pulse that is synchronized with a switching opportunity of a PWM controller;
- combining the tickle pulse with the voltage error signal to form a combined signal; and
- applying the combined signal to a control input of the PWM controller to control periods of switching and no switching in the PWM power supply by a hysteretic window of the voltage error signal.

25. The method of claim 24 wherein generating a tickle pulse comprises:
- dividing an oscillator clock signal by a predetermined factor to provide a divided pulse signal;
- adding a delay to the pulse signal to synchronize it with the switching opportunity of the PWM controller; and
- shaping the pulse signal to obtain pulses with a longer decay while maintaining a fast attack to form the tickle pulse signal.

\* \* \* \* \*